United States Patent [19]
Yoshizawa et al.

[11] Patent Number: 5,675,223
[45] Date of Patent: Oct. 7, 1997

[54] CIRCUIT BOARD UNIT FOR DRIVING AND CONTROLLING MOTOR THAT DRIVES COMPRESSOR FOR AIR-CONDITIONER

[75] Inventors: Kouki Yoshizawa; Seiichi Hoshino; Toshimasa Kawabata, all of Isesaki, Japan

[73] Assignee: Sanden Corp., Isesaki, Japan

[21] Appl. No.: 644,648

[22] Filed: May 7, 1996

[30] Foreign Application Priority Data

May 25, 1995 [JP] Japan ................. 7-126148

[51] Int. Cl.$^6$ ............................................. H02P 1/00
[52] U.S. Cl. .................. 318/139; 318/254; 318/439; 318/558; 361/709; 361/720; 361/752
[58] Field of Search ............... 318/139, 798–815, 318/439, 254, 491, 558; 361/600, 679, 688, 704, 707, 709–716, 717–721, 736, 748, 760–1, 763–764, 752

[56] References Cited

U.S. PATENT DOCUMENTS

| | | | |
|---|---|---|---|
| 4,795,867 | 1/1989 | Ohi et al. | 200/37 R |
| 5,012,656 | 5/1991 | Tamura | 361/388 |
| 5,038,091 | 8/1991 | Bashark | 318/809 |
| 5,179,842 | 1/1993 | Kanazawa | 318/811 |
| 5,497,289 | 3/1996 | Sugishima et al. | 361/709 |
| 5,548,481 | 8/1996 | Salisbury et al. | 361/709 |
| 5,581,254 | 12/1996 | Rundel | 318/811 |

*Primary Examiner*—David S. Martin
*Attorney, Agent, or Firm*—Kenjiro Hidaka

[57] ABSTRACT

A circuit board unit for driving and controlling a motor that drives a compressor for an air-conditioner has a first mounting base, a second mounting base mounted on the first mounting base, and a printed circuit board mounted on the second mounting base. The first mounting base has thereon a first group of high voltage electrical elements belonging to a motor driving circuit and a heat sink so that some of the high voltage electrical elements that need positive heat dissipation are mounted thereon. The second mounting base has thereon a second group of high voltage electrical elements belonging to the motor driving circuit and a plurality of flat electrical conductors that are partially embedded in the second mounting base in an insert mold fashion and forming a predetermined wiring pattern so as to electrically connect the high voltage electrical elements. The printed circuit board has thereon a group of low voltage electrical elements belonging to a motor control circuit.

4 Claims, 4 Drawing Sheets

CIRCUIT BOARD UNIT FOR DRIVING AND CONTROLLING MOTOR THAT DRIVES COMPRESSOR FOR AIR-CONDITIONER

BACKGROUND OF THE INVENTION

1. Field of the Invention

The present invention pertains to a circuit board unit for driving and controlling a motor that drives a compressor for an air-conditioner used particularly in a vehicle and, therefore, powered from a dc power source.

2. Description of the Prior Art

An air-conditioner used in a vehicle powered from a dc power source is controlled by turning on or off or changing the rotational speed of the compressor motor employed in the air-conditioner. A circuit board unit for driving and controlling the compressor motor is often called an "invertor unit" because the power is provided from a battery and the motor is typically a dc brushless motor or an induction motor which requires multi-phase driving currents.

Electrical elements in the motor driving circuit of the circuit board unit are subjected to substantially high voltages and large currents as opposed to those in the control circuit, which require a low signal level voltage and little currents. Since the control circuit is subjected to a low voltage and little currents, the circuit is normally made in a "printed circuit". On the other hand, a typical conventional high voltage motor driving circuit has electrical elements disposed on a base plate and the elements are individually connected with conductor wires.

(Problem to be Solved by the Present Invention)

In a conventional circuit board unit, since high voltage electrical elements of a motor driving circuit are individually connected with conductor wires after the elements have been mounted on a base plate, a substantial time has to be consumed for the wiring process. Furthermore, spaces are required in between the elements for the conductor wires to be disposed and soldered or otherwise connected.

SUMMARY OF THE INVENTION

In view of the above mentioned situation, the object of the present invention is to provide a compact circuit board unit for driving and controlling a motor, which drives a compressor for an air-conditioner, that takes multi-phase drive currents from a dc power source, in which high voltage electrical elements of the motor driving circuit are electrically connected without a time-consuming individual wiring process after the elements have been mounted on mounting bases.

In order to achieve the above object, the circuit board unit according to the present invention has a first mounting base, a second mounting base mounted on the first mounting base, and a printed circuit board mounted on the second mounting base spaced therefrom. The first mounting base has thereon a first group of high voltage electrical elements belonging to the motor driving circuit that is subjected to high voltages for driving the motor. The second mounting base has thereon a second group of the high voltage electrical elements belonging to the motor driving circuit. The second mounting base also has a plurality of electrical conductors that are partially embedded therein forming a wiring pattern predetermined according to the positions of the high voltage electrical elements to be mounted on the first and the second mounting bases by means of an insert molding technique at the time the second mounting base is produced by molding.

Thus, the high voltage electrical elements mounted on the first and the second mounting bases can be readily electrically connected with the electrical conductors already embedded in the second mounting base. Therefore, a time-consuming wiring process for connecting the high voltage electrical elements can be eliminated. The printed circuit board has thereon a group of low voltage electrical elements belonging to a motor control circuit that is subjected to a low voltage for controlling the motor.

The first mounting base further has a heat sink that is fixedly attached thereto and electrical elements that need positive heat dissipation out of the first group of high voltage electrical elements are directly mounted thereon.

DETAILED DESCRIPTION OF THE PREFERRED

Figure 1:
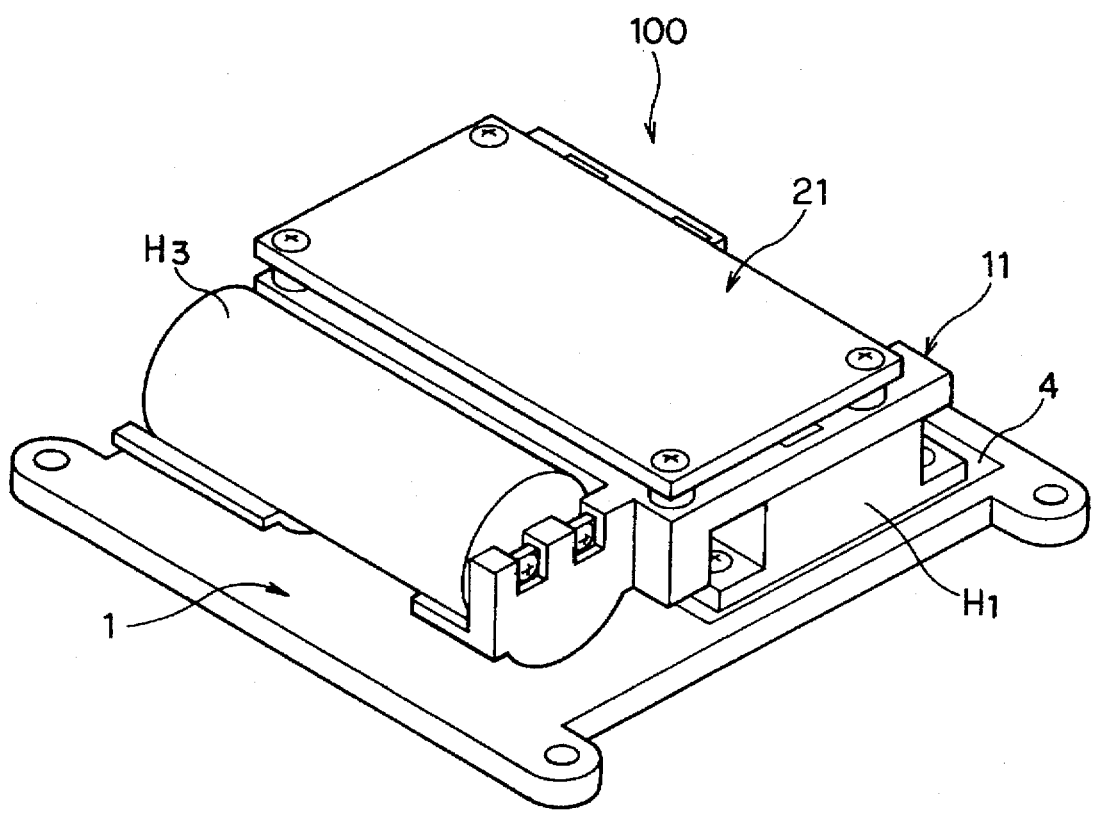
FIG. 1 is a perspective view of a circuit board unit according to the present invention.

FIG. 1 is a perspective view of a circuit board unit 100, according to the present invention, for driving and controlling a motor that drives a compressor for an air-conditioner used in a vehicle and powered from a dc power supply. The circuit board unit 100 has a first mounting base 1 that is the primary base thereof, a second mounting base 11 that is fixedly mounted on the first mounting base 1, and a printed circuit board 21 that is fixedly mounted on the second mounting base 11 spaced therefrom. Reference characters 4, H1 and H3 in FIG. 1 denote a heat sink plate, a power transistor module and a high voltage capacitor, respectively, all of which will be explained later in detail.

Figure 2:
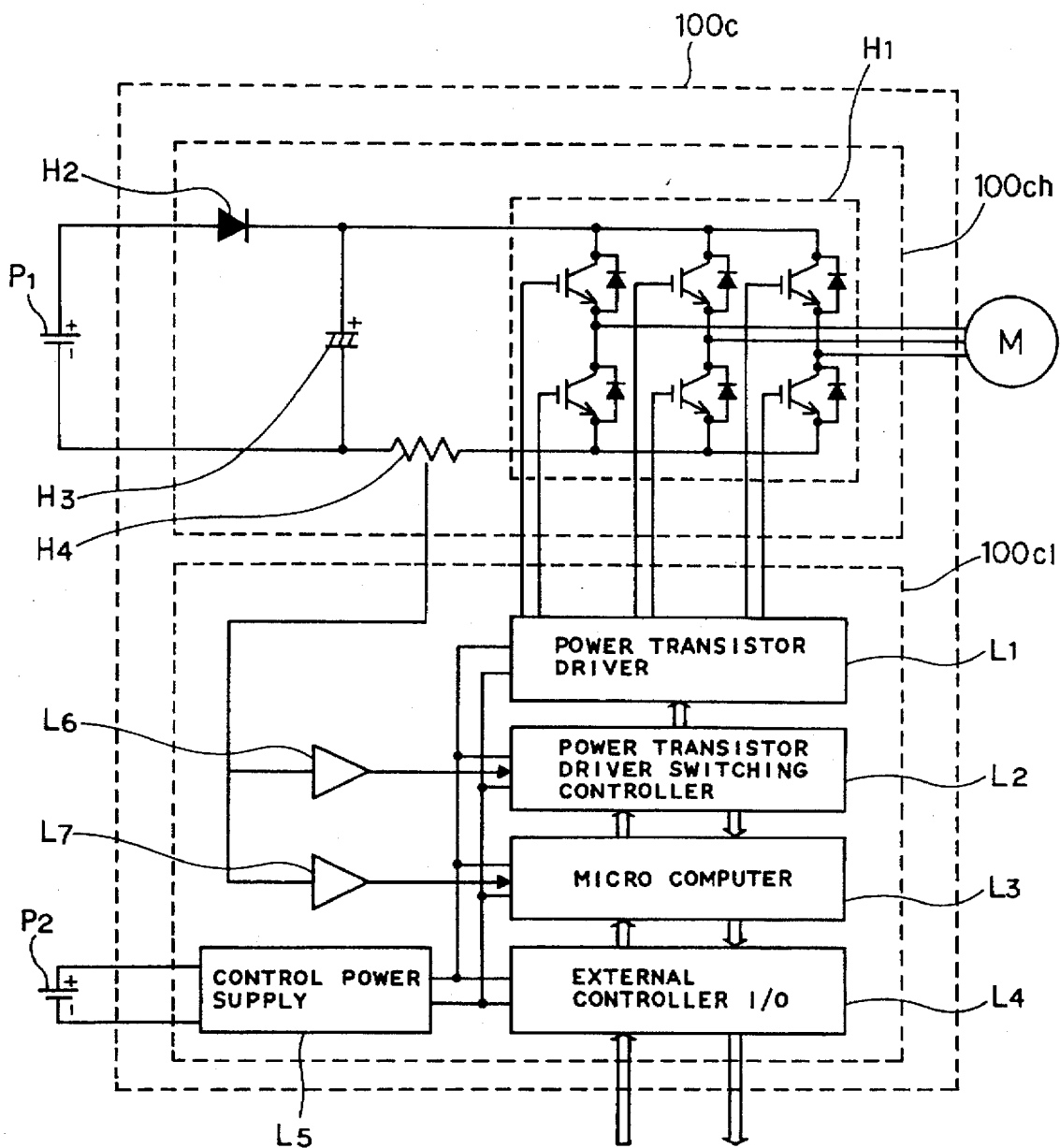
FIG. 2 shows a circuit diagram of an electrical circuit that is built in the circuit board unit shown in FIG. 1.

FIG. 2 is a circuit diagram of an electrical circuit 100c that is built in the circuit board unit 100 shown in FIG. 1. The circuit 100c is one of prior known circuits for controlling and driving a compressor motor for a vehicle air-conditioner using dc power sources. The circuit 100c per se is not an object of the invention and, therefore, no detail explanation thereon will be made.

One part of the circuit 100c enclosed by a ghost line frame 100ch is a high voltage drive circuit 100ch for driving a compressor motor M that is powered by a high voltage dc power source (or, battery) P1. The main electrical elements included in the high voltage drive circuit 100ch are: a power transistor module H1, a power diode H2, a high voltage capacitor H3, and a resistor H4 for current level pick-up. The voltage provided by the dc power source P1 is in the range of 100–400V±30% (i.e. 70–520V).

Another part of the circuit 100c enclosed by a ghost line frame 100cl is a low voltage control circuit 100cl for controlling the power transistor module H1 of the high voltage drive circuit 100ch so that the motor M is turned on or off or the rotational speed thereof is regulated. The main electrical elements included in the low voltage control circuit 100cl are: a power transistor driver L1, a power transistor driver switching controller L2, a micro computer L3, an external controller I/O L4, a control power supply L5, an over-current detector L6, and an average current detector L7. The low voltage control circuit 100cl is powered from a low voltage dc power source (or, battery) P2 that has a voltage in the range of 12V±30% (i.e. 8.4~15.6V). The external controller I/O L4 receives a control signal from an external air-conditioner control (not shown) for turning on or off the motor or regulating the rotational speed of the motor, thereby controlling the air-conditioner (not shown) driven by the motor M. Since the function of the circuit 100c is also well known in the industry, no detail explanation thereon will be made.

Figure 3:
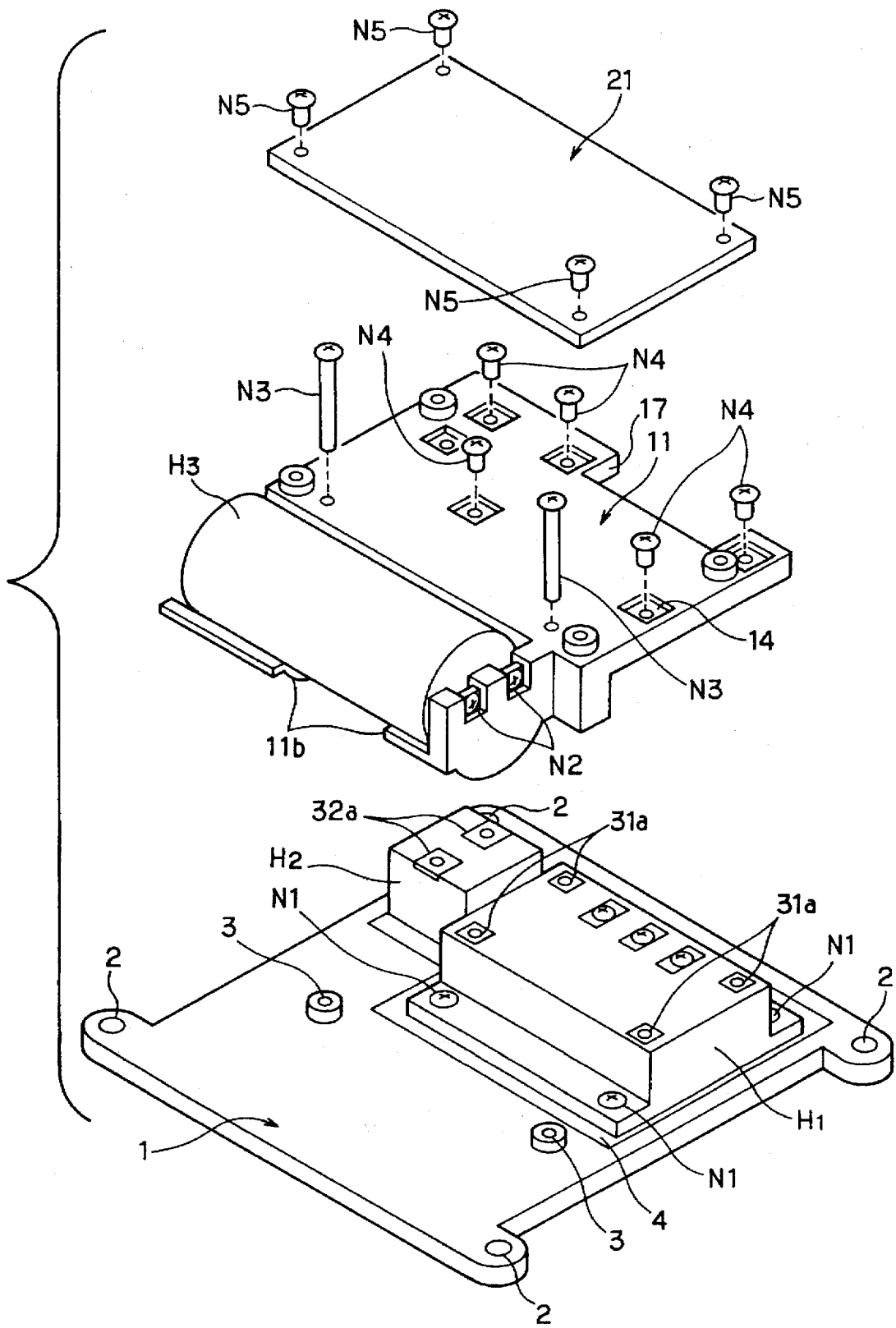
FIG. 3 is an exploded perspective view of the circuit board unit shown in FIG. 1.
Figure 4:
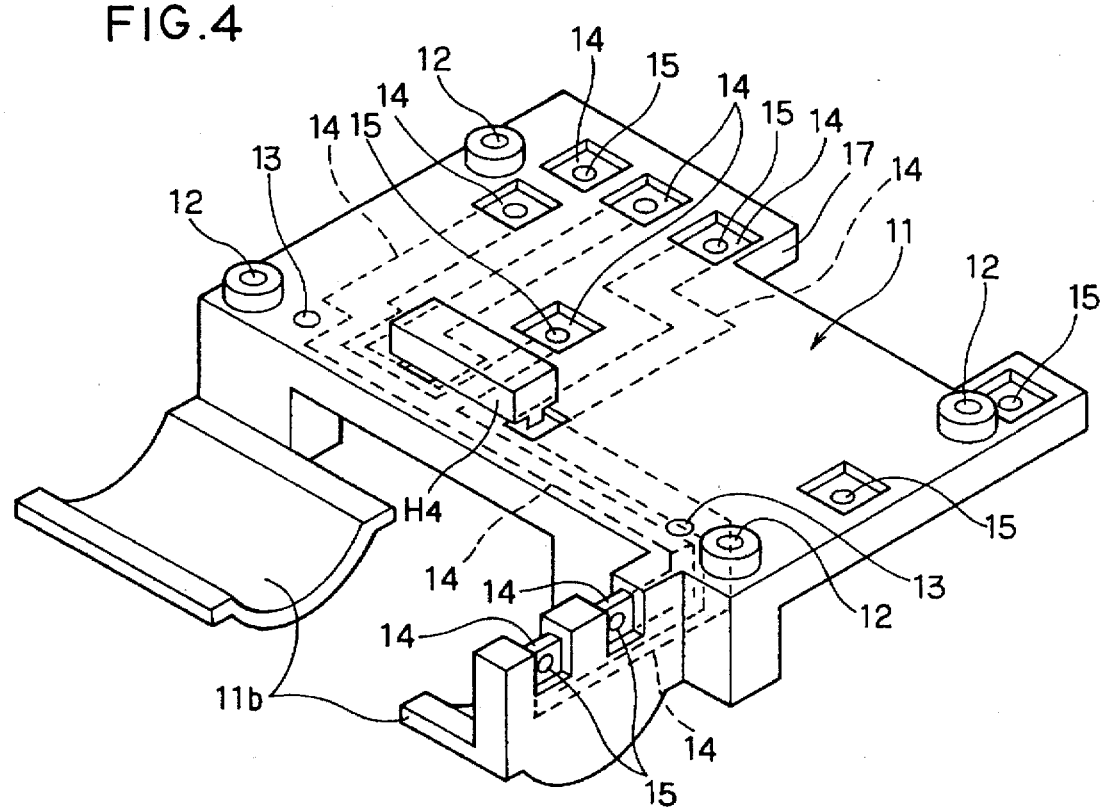
FIG. 4 is a perspective view of a second mounting base that is a component of the circuit board unit shown in FIG. 1.
Figure 5:
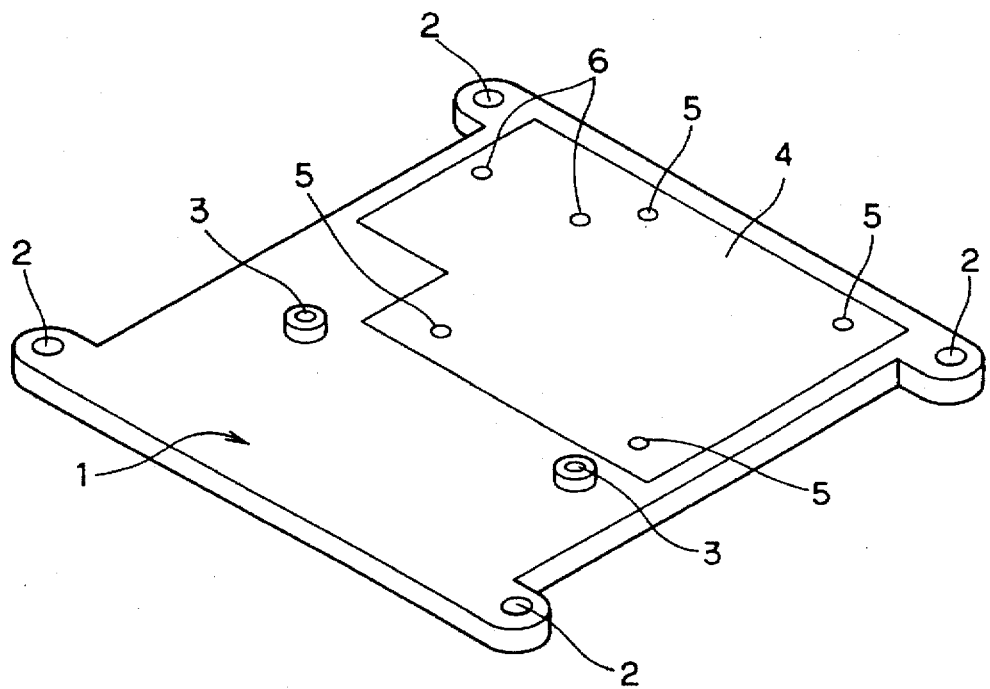
FIG. 5 is a perspective view of a first mounting base that is another component of the circuit board unit shown in FIG. 1.

FIG. 3 is an exploded perspective view of the circuit board unit 100, FIG. 4 is a perspective view of the second mounting base 11 and FIG. 5 is a perspective view of the first mounting base 1.

In reference to FIGS. 3 to 5, a first group of electrical elements, including the power transistor module H1 and the power diode H2, that belong to the high voltage circuit 100ch are mounted on the first mounting base 1. A second group of electrical elements, including the high voltage capacitor H3 and the resistor H4, that also belong to the high voltage circuit 100ch are mounted on the second mounting base 11.

The first mounting base 1 is made of a resin by means of molding. As shown in FIGS. 3 and 5, the first mounting base 1 has four through screw holes 2 at four respective corner sections thereof for mounting the entire circuit board unit 100, and a pair of screw holes 3 for mounting the second mounting base 11 thereon. An aluminum heat sink plate 4 is securely fixed to the first mounting base 1 by means of an insert molding method in a manner that peripheral parts of the heat sink plate 4 are embedded in the first mounting base 1 but most parts of both the top and the bottom sides thereof are exposed so that heat dissipation can be done efficiently. The heat sink plate 4 has screw holes 5, for mounting the power transistor module H1 directly thereon, and screw holes 6, for mounting the power diode H2 directly thereon.

The second mounting base 11 is also made of a resin by means of molding. As shown in FIG. 4, the second mounting base 11 has four screw holes 12 at corner sections thereon, for mounting the printed circuit board 21, and a pair of through screw holes 13, in alignment with the screw holes 3 on the first mounting base 1, for mounting the second mounting base 11 itself on the first mounting base 1.

The second mounting base 11 has flat elongated electrical conductors 14 that are disposed partially embedded in the second mounting base 11 according to a predetermined wiring pattern. The wiring pattern is determined conforming to the positions of the high voltage electrical elements mounted on the first and the second mounting bases 1 and 11. The electrical conductors 14 are intended for facilitating electrical connections of the high voltage electrical elements mounted on the first and the second mounting bases 1 and 11. The flat conductors 14 are initially formed from one-piece copper sheet by means of pressing and, then, are inserted to a mold that forms the second mounting base 11, so that the conductors 14 are partially but substantially embedded in the second mounting base 11 when the molding thereof is completed. Parts of the conductors 14, which need to be electrically connected with high voltage electrical elements and the high voltage dc power source P1, are exposed. As shown in FIG. 4, each of the exposed parts of the partially embedded conductors 14 has a screw hole 15. The second mounting base 11 integrally has a bracket 11b on one side thereof for holding thereon the high voltage capacitor H3 and a cutout 17 on the other side thereof so that a part of the power transistor module H1 fits in the cutout 17.

All of the electrical elements in the low voltage circuit 100cl are mounted on the printed circuit board 21, which is of a conventional type.

Now, how the circuit board unit 100 is assembled will be explained in reference to FIGS. 2 to 5. First, the power transistor module H1 and the power diode H2 are mounted on the heat sink 4 in the first mounting base 1 with screws N1, and the high voltage capacitor H3 is mounted on the bracket 11b of the second mounting base 11 and the terminals thereof are individually connected to the respective connecting conductors 14 with screws N2. Other high voltage electrical elements, including the resistor H4, are mounted on the second mounting base 11 and also electrically connected to parts of the connecting conductors 14.

Next, the second mounting base 11 is placed on the first mounting base 1 and fixed thereto with a pair of screws N3. Screws N4 are screwed to respective screw holes 31a on the power transistor module H1 and a screw hole 32a on the power diode H2 through the respective screw holes 15 of the second mounting base 11, so that the high voltage electrical elements are electrically connected with the connecting conductors 14 partially embedded in the second mounting base 11. The terminals of the high voltage dc power source P1 are electrically connected with a pair of the connecting conductors 14. The printed circuit board 21 is mounted on the second mounting base 11, but spaced therefrom, with screws N5. The printed circuit board 21 has thereon all of the low voltage electrical elements belonging to the low voltage circuit 100cl shown in FIG. 2.

Any necessary electrical connections between the high voltage electrical elements and the low voltage electrical elements may be made by first installing connecting pin conductors (not shown) at proper positions on the second mounting base 11 perpendicularly thereto and connecting the pin conductors to proper parts of the low voltage printed circuit 100cl on the printed circuit board 21. The low voltage dc power source P2 is electrically connected to the low voltage circuit 100cl.

The assembled circuit board unit 100, as shown in FIG. 1, is secured by screws (not shown) at the screw holes 2, and electrically connected with the compressor motor M (FIG. 2), which is to be driven and controlled by the circuit board unit 100.

On the underside surface of the heat sink plate 4 is disposed in contact therewith a water-circulating cooling device (not shown), so that the power transistor module H1 and the power diode H2 mounted on the heat sink plate 4 are positively cooled through the heat sink plate 4 by circulating cooling water.

As explained above, since the circuit board unit 100 consists mainly of the three major subassemblies, i.e. the first mounting base 1, the second mounting base 11, and the printed circuit board 21, with respective groups of electrical elements mounted thereon, the entire circuit board unit 100 can be produced easily by first preparing each of these three subassemblies and putting them together with screws.

Since all of the high voltage electrical elements, other than the power transistor module H1 and the power diode H2, are mounted on the second mounting base 11 and high voltage connecting conductors 14 are pre-installed in the second mounting base 11 at the time the board 11 is produced by molding, a conventional process of installing connecting wires to and from the high voltage electrical elements individually can be omitted and, furthermore, substantial space saving is achieved, whereby the circuit board unit 100 can be made compact, simple and economical.

Since the circuit board unit 100 can be made compact, the unit 100 can be easily installed in a limited space of a vehicle when the unit 100 is used to drive and control a compressor motor for an air-conditioning system of the vehicle.

A further advantage of the circuit board unit 100 is that since the high voltage electrical elements are mounted on the first and the second mounting bases 1 and 11 separately from the low voltage electrical elements that are all mounted on the printed circuit board 21, the low voltage control circuit 100cl is relatively immune to any electrical noise of the high voltage driving circuit 100ch. The low voltage control circuit 100cl can be kept from being affected by the high voltage drive circuit 100ch more positively by disposing the printed circuit board 21 farther apart from the second mounting base 11 or, alternatively, by placing a shielding material therebetween.

Since the first mounting base 1 is molded with the heat sink plate 4 partially embedded therein, the production process is additionally simplified and the total weight of the circuit board unit 100 can be minimized.

It will be understood that various changes and modifications may be made in the above described embodiments which provide the characteristics of the present invention without departing from the spirit and principle thereof particularly as defined in the following claims.

What is claimed is:

1. A circuit board unit for driving and controlling a motor that drives a compressor for an air-conditioner, comprising:

a. a first mounting base;

b. a first group of high voltage electrical elements mounted on said first mounting base, said first group of high voltage electrical elements belonging to a motor driving circuit that is subjected to a voltage in a first voltage range required for driving the motor;

c. a second mounting base mounted on said first mounting base, said second mounting base being a molded electrically insulating material and having a plurality of electrical conductors partially embedded therein in an insert mold fashion, said electrical conductors forming a predetermined wiring pattern;

d. a second group of high voltage electrical elements, which belong to said motor driving circuit, mounted on said second mounting base; and e. a printed circuit board mounted on said second mounting base spaced therefrom, said printed circuit board having thereon a group of low voltage electrical elements belonging to a motor control circuit that is subjected to a voltage in a second voltage range for controlling the motor, said second voltage range being lower than said first voltage range; wherein at least parts of said first and second groups of high voltage electrical elements are electrically connected with said electrical conductors that are partially embedded in said second mounting base.

2. A circuit board unit according to claim 1, wherein the circuit board unit further comprises a heat sink that is securely fixed to said first mounting base and some of said first group of electrical elements that need positive heat dissipation are directly mounted on said heat sink.

3. A circuit board unit according to claim 1, wherein said first voltage range is a range from 70 volts to 520 volts and said second voltage range is a range from 8.4 volts to 15.6 volts.

4. A circuit board unit according to claim 1, wherein said electrical conductors partially embedded in said second mounting base are elongated flat metal pieces.

* * * * *